United States Patent
Massimino

(10) Patent No.: US 8,477,050 B1
(45) Date of Patent: Jul. 2, 2013

(54) APPARATUS AND METHOD FOR ENCODING USING SIGNAL FRAGMENTS FOR REDUNDANT TRANSMISSION OF DATA

(75) Inventor: Pascal Massimino, Cupertino, CA (US)

(73) Assignee: Google Inc., Mountain View ( * ) Notice: Subject to any disclaimer, the term of this patent is extended or adjusted under 35 U.S.C. 154(b) by 20 days.

(21) Appl. No.: 13/233,640

(22) Filed: Sep. 15, 2011

Related U.S. Application Data

(60) Provisional application No. 61/383,526, filed on Sep. 16, 2010.

(51) Int. Cl.
*H03M 7/34* (2006.01)

(52) U.S. Cl.
USPC .............. 341/51; 713/168; 713/340; 707/693; 707/698; 707/827; 382/100; 382/245; 382/253; 704/201; 704/203; 704/205; 704/207; 704/212; 375/137; 375/150; 375/377; 375/250.22; 375/240.16

(58) Field of Classification Search
USPC ................. 713/168, 303, 340; 707/693, 698, 707/827; 382/100, 245, 253; 704/201, 203, 704/205, 207, 212, 267, 275; 341/50–90; 375/147, 150, 377, E1.002, 240.22, 240.16
See application file for complete search history.

(56) References Cited

U.S. PATENT DOCUMENTS

| | | | |
|---|---|---|---|
| 5,473,326 A | 12/1995 | Harrington | |
| 6,011,824 A * | 1/2000 | Oikawa et al. | 375/377 |
| 6,047,255 A * | 4/2000 | Williamson | 704/212 |
| 6,061,821 A | 5/2000 | Schlosser | |
| 6,453,283 B1 * | 9/2002 | Gigi | 704/207 |
| 6,597,812 B1 | 7/2003 | Fallon | |
| 6,885,986 B1 * | 4/2005 | Gigi | 704/207 |
| 7,003,039 B2 | 2/2006 | Zakhor | |
| 7,068,710 B2 * | 6/2006 | Lobo et al. | 375/150 |
| RE42,272 E | 4/2011 | Zakhor | |
| 8,050,446 B2 * | 11/2011 | Kountchev et al. | 382/100 |
| 8,326,061 B2 * | 12/2012 | Massimino | 382/235 |
| 8,352,737 B2 * | 1/2013 | Solis et al. | 713/168 |
| 2003/0018647 A1 | 1/2003 | Bialkowski | |
| 2003/0058943 A1 | 3/2003 | Zakhor | |

OTHER PUBLICATIONS

"Series H: Audiovisual and Multimedia Systems; Infrastructure of audiovisual services—Coding of moving video; Advanced video coding for generic audiovisual services". H.264. Version 1. International Telecommunication Union. Dated May 2003.

"Series H: Audiovisual and Multimedia Systems; Infrastructure of audiovisual services—Coding of moving video; Advanced video coding for generic audiovisual services". H.264. Version 3. International Telecommunication Union. Dated Mar. 2005.

(Continued)

*Primary Examiner* — Lam T Mai
(74) *Attorney, Agent, or Firm* — Young Basile Hanlon & MacFarlane P.C.

(57) ABSTRACT

A system and method for redundant transmission is provided. In one embodiment, an input signal S is encoded as a list of fragments. Each fragment includes an index value and a projection value. The index points to an entry in a dictionary of signal elements. A repetition factor is assigned to each fragment based on its importance. After a fragment is added, a reconstructed signal is generated by decoding the list of fragments. Encoding terminates once the reconstructed signal is sufficiently close to the original signal S.

25 Claims, 6 Drawing Sheets

OTHER PUBLICATIONS

"Overview; VP7 Data Format and Decoder". Version 1.5. On2 Technologies, Inc. Dated Mar. 28, 2005.

"Series H: Audiovisual and Multimedia Systems; Infrastructure of audiovisual services—Coding of moving video; Advanced video coding for generic audiovisual services". H.264. Amendment 1: Support of additional colour spaces and removal of the High 4:4:4 Profile. International Telecommunication Union. Dated Jun. 2006.

"VP6 Bitstream & Decoder Specification". Version 1.02. On2 Technologies, Inc. Dated Aug. 17, 2006.

"Series H: Audiovisual and Multimedia Systems; Infrastructure of audiovisual services—Coding of moving video". H.264. Amendment 2: New profiles for professional applications. International Telecommunication Union Dated Apr. 2007.

"VP6 Bitstream & Decoder Specification". Version 1.03. Ont Technologies, Inc. Dated Oct. 29, 2007.

"Series H: Audiovisual and Multimedia Systems; Infrastructure of audiovisual services—Coding of moving video". H.264. Advanced video coding for generic audiovisual services. Version 8. International Telecommunication Union. Dated Nov. 1, 2007.

"Series H: Audiovisual and Multimedia Systems; Infrastructure of audiovisual services—Coding of moving video". H.264. Advanced video coding for generic audiovisual services. International Telecommunication Union. Version 11. Dated Mar. 2009.

"Series H: Audiovisual and Multimedia Systems; Infrastructure of audiovisual services—Coding of moving video". H.264. Advanced video coding for generic audiovisual services. International Telecommunication Union. Version 12. Dated Mar. 2010.

"Implementors' Guide; Series H: Audiovisual and Multimedia Systems; Coding of moving video: Implementors Guide for H.264: Advanced video coding for generic audiovisual services". H.264. International Telecommunication Union. Version 12. Dated Jul. 30, 2010.

"VP8 Data Format and Decoding Guide". WebM Project. Google On2. Dated: Dec. 1, 2010.

Bankoski et al. "VP8 Data Format and Decoding Guide; draft-bankoski-vp8-bitstream-02" Network Working Group. Dated May 18, 2011.

Bankoski et al. "Technical Overview of VP8, an Open Source Video Codec for the Web". Dated Jul. 11, 2011.

* cited by examiner

| 52 | DICTIONARY | 54 |
|---|---|---|
| INDEX | | VALUE |
| 000001 | | 599489202 |
| 000002 | | 302494353 |
| 000003 | | 496653649 |
| 000004 | | 993499994 |
FIG. 6
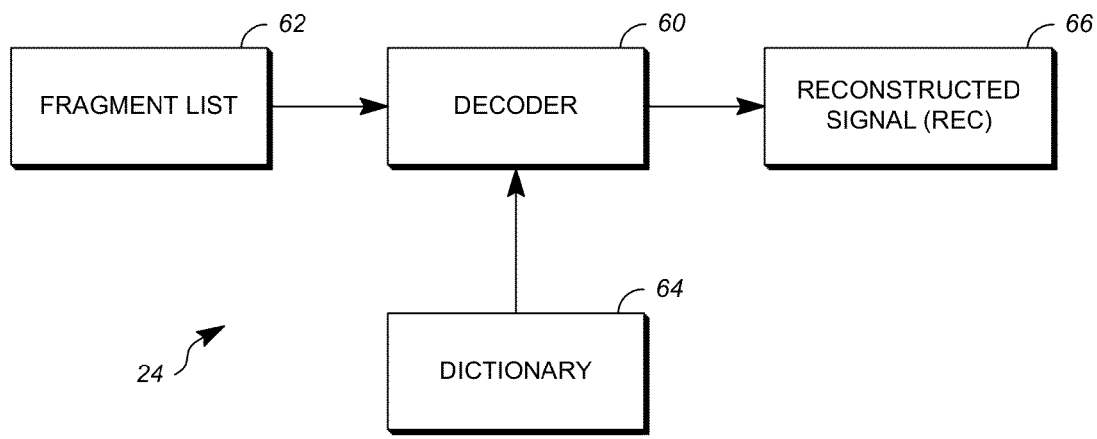
FIG. 7
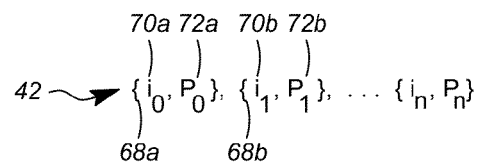
FIG. 8

APPARATUS AND METHOD FOR ENCODING USING SIGNAL FRAGMENTS FOR REDUNDANT TRANSMISSION OF DATA

CROSS-REFERENCE TO RELATED APPLICATIONS

This application claims priority to U.S. Provisional Patent Application No. 61/383,526, filed Sep. 16, 2010, which is hereby incorporated by reference in its entirety.

TECHNICAL FIELD

The present invention relates in general to data transmission and in particular to redundant data transmission.

BACKGROUND

Data communications protocols such as Transmission Control Protocol have been developed over many years. These protocols transmit data in packets, which can be lost during transmission due to a variety of factors, such as transmission errors and network congestion. To address this problem, it is known to provide data redundancy, in which a packet is transmitted more than once. For example, a space satellite can transmit a low bit rate signal over a lossy forward link to a receiving station. The satellite may not have a return link to communicate whether a packet is received. Therefore, the satellite transmits redundant packets to increase the probability of successful reconstruction of the signal at the receiving station.

SUMMARY

Apparatuses and methods for redundant transmission of data are disclosed. One aspect of the disclosed embodiments is a method for encoding a data signal. The method includes accessing a set of signal elements stored in memory, and generating a plurality of signal fragments. At least some of the signal fragments are each associated with at least one signal element selected from the set of signal elements, and a transform value. The transform value is calculated as a function of at least a portion of the data signal and the fragment's associated signal element.

In another aspect of the disclosed embodiments, a method is taught for encoding a data signal. The method includes accepting as input the data signal to be encoded; storing in memory a set of signal elements that includes elements not found in the data signal; and generating a list of fragments from which can be derived an approximation of the data signal. At least some of the fragments include or otherwise reference (such as by an index) a different one of the set of signal elements. The list of fragments is generated by an iterative process of adding at least one new fragment to the list of fragments, using the list of fragments to generate a reconstructed signal, and using a processor to determine the fidelity of the reconstructed signal. This iterative process may be repeated until the fidelity reaches a threshold.

In yet another aspect of the disclosed embodiments, an apparatus is taught for encoding a data signal. The apparatus includes a memory and a processor coupled to the memory and configured to execute instructions stored in memory. The instructions cause the processor to select a plurality of signal elements from a set of signal elements; for at least one of the selected plurality of signal elements, calculate a projection value as a function of the selected signal element and at least a portion of the data signal; and generate a plurality of signal fragments, at least one signal fragment including the projection value and a value associating the fragment with that one of the selected plurality of signal elements used to generated the projection value.

BRIEF DESCRIPTION OF THE DRAWINGS

The description herein makes reference to the accompanying drawings wherein like reference numerals refer to like parts throughout the several views, and wherein:

FIG. 6 is a diagram of a dictionary used by the data encoder of FIG. 3 and the decoder of FIG. 7;

FIG. 7 is a block diagram of the receiving station of FIG. 1;

FIG. 8 is a diagram of a fragment list generated as output by the data encoder of FIG. 3;

DETAILED DESCRIPTION

In one embodiment, a signal (S) is decomposed during encoding into a plurality of data elements or fragments. In general terms, each fragment includes an index value and a projection value. The index value points to an entry in a dictionary or other data structure of signal elements $U_i$. This encoding process can take place iteratively so that signal fragments are added one-by-one to a growing list of fragments until the list contains sufficient fragments to permit adequate reconstruction of the original signal S.

The first step in this iterative process can include generating a reconstructed signal (REC) by decoding the fragments already in the list. This step can be skipped for the first iteration if the list is empty. Alternatively, the list can be initialized with an arbitrarily selected signal element selected without use of the reconstructed signal REC. A residual signal (R) is determined by subtracting the reconstructed signal REC from the original signal S. If the residual signal R is at or below a threshold (which can be zero), encoding processing can be completed. Otherwise, a new fragment is added to the list of fragments.

In one illustrative embodiment, the process of adding a new fragment begins by searching the dictionary for the signal element $U_i$ that maximizes the scalar product $<R, U_i>$, where R is the residual signal. The new fragment can include the value of i (the location in the dictionary where the selected signal element $U_i$ resides) and a projection value, which can be equal to the scalar product of $<S, U_i>$. Next, the new fragment is added to the existing list of fragments. A repetition factor is assigned to the new fragment. In one illustrative embodiment, the repetition factor can be a monotonic function of the scalar product's absolute value $<R, U_i>$, which provides an indication of the transfer energy associated with (and thus may indicate the relative importance of) the fragment. In the output (Y) of the encoder, the fragment can be duplicated depending on the value of the repetition factor. The dictionary entry corresponding to the newly-added fragment is deleted or flagged so that it will not be used in a subsequently generated fragment.

The process of decoding is used by the encoder itself (to create the reconstructed signal REC as described above) and also by a decoder in a receiving station that receives the encoded signal. The decoding process can begin by removing duplicate fragments having the same index value. An array of amplitude values $A_0 \ldots A_N$ is determined for the N remaining fragments by performing a transform using the projection values contained in at least a plurality of fragments. The reconstructed signal REC can then be generated by computing the sum over all N fragments of $A_k * U_{i,k}$.

Figure 1:
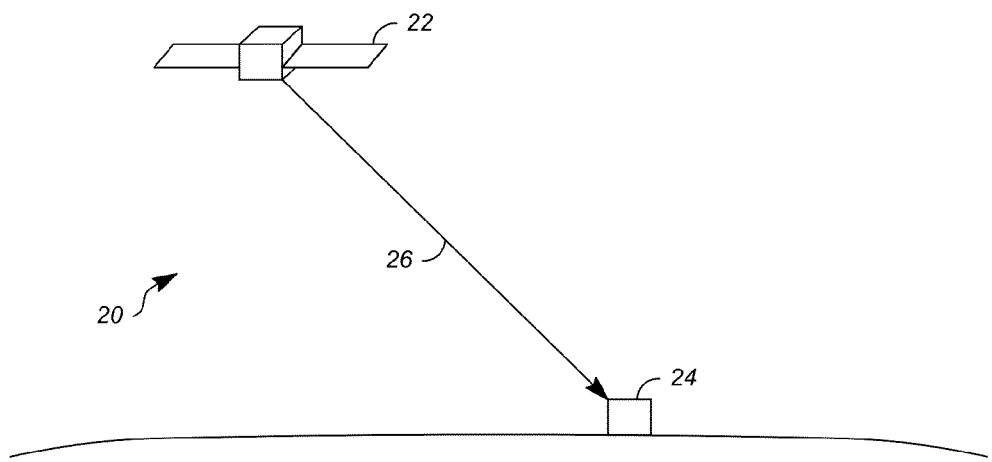
FIG. 1 is a schematic diagram of a communications network including a transmission station.

FIG. 1 is a schematic diagram of one exemplary embodiment in which a communications network 20 includes a transmission station 22, which in this illustration is a space-borne satellite, and a receiving station 24, which in this case is a mobile tracking device coupled to a moving vehicle (not shown). Transmission station 22 communicates with receiving station 24 by broadcasting a packetized radio-frequency signal over a lossy forward link 26.

Communications network 20 can be implemented in a variety of configurations, and the embodiment of FIG. 1 is shown merely for illustration. For example, transmission station 22 can be a terrestrial radio or laser transmitter (e.g., used in fiber optic communications) or a computer coupled to a network. Forward link 26 can be wireless or wired, or a combination of both. A variety of transport protocols could be employed in forward link 26.

Owing to power constraints, weather conditions or other circumstances, there may be no return link to permit transmission of data from receiving station 24 to transmission station 22. As a result, transmission station 22 can send data to receiving station 24 without acknowledgment of the reception of packets. In other embodiments, a return link can be provided so that transmission station 22 and receiving station 24 can have full or partial bi-directional communication.

Forward link 26 can be lossy, owing to poor signal quality, transmission error, network congestion, signal obstruction or other causes. If forward link 26 is lossy, packets transmitted between transmission station 22 and receiving station 24 can be lost, resulting in signal degradation. To ensure successful transmission, transmission station 22 can transmit redundant packets of data along forward link 26. This consumes bandwidth and it can be beneficial if the redundant transmission is optimized to maximize the fidelity of the reconstructed signal at receiving station 24.

It will be understood that the term packets as used in this specification is used in its broadest sense and includes datagrams, segments, blocks, cells and/or frames depending on the transmission protocol that is used. The embodiments as described herein can be used with a range of protocols and the invention is not intended to be limited to any one particular protocol.

Figure 2:
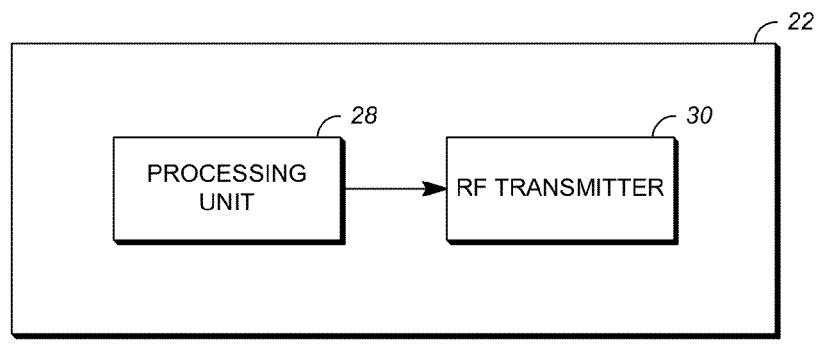
FIG. 2 is a block diagram of the transmission station shown in FIG. 1.

FIG. 2 is a block diagram of the transmission station 22 shown in FIG. 1. In one exemplary embodiment, transmission station 22 includes a processing unit 28 and a transmitter, e.g., radio frequency (RF) transmitter 30. Processing unit 28 performs the encoding of data described below and RF transmitter 30 transmits the resulting encoded signal using radio frequency(ies). Processing unit 28 can be realized in hardware, software, or any combination thereof including, for example, IP cores, ASICS, programmable logic arrays, programmable logic controllers, microcode, firmware, microcontrollers, microprocessors, digital signal processors or any other suitable implementation. Processing unit 28 can alternatively include a general purpose computer/processor with a computer program that, when executed, carries out any of the respective methods, algorithms and/or instructions described herein. In addition or alternatively, for example, a special purpose computer/processor can be utilized which can contain specialized hardware for carrying out any of the methods, algorithms and/or instructions described herein.

Figure 3:
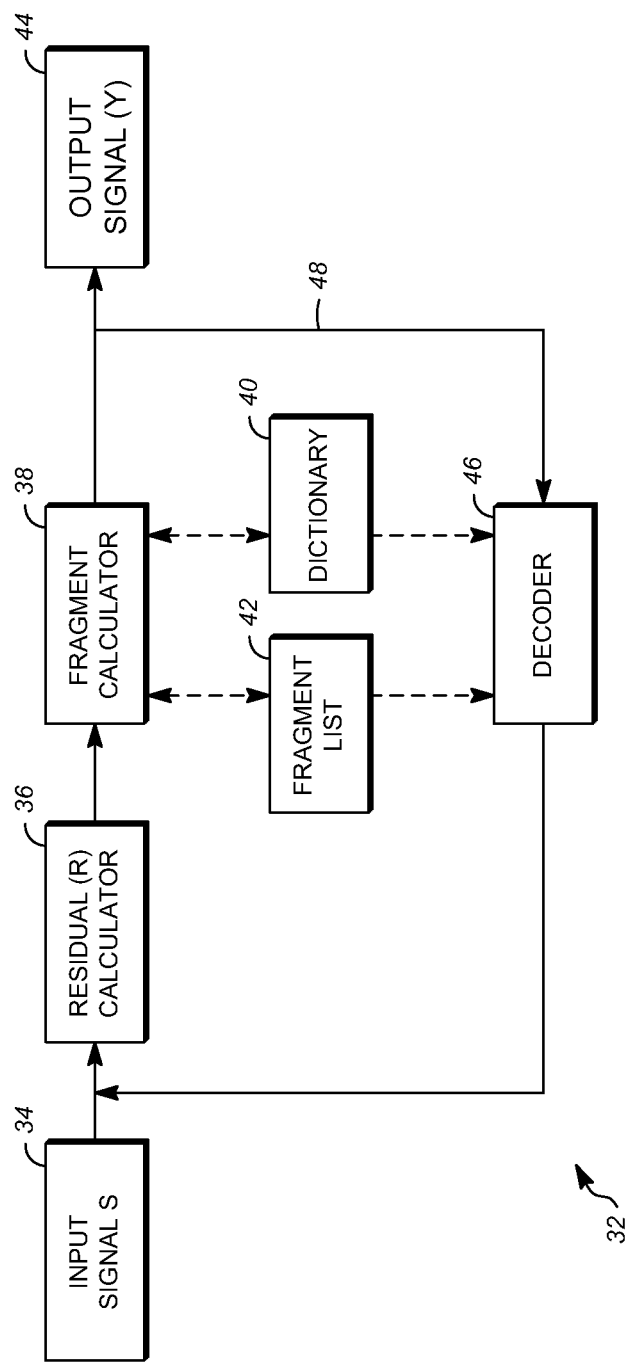
FIG. 3 is a block diagram of the encoder used in the transmission station of FIG. 1.
Figure 4:
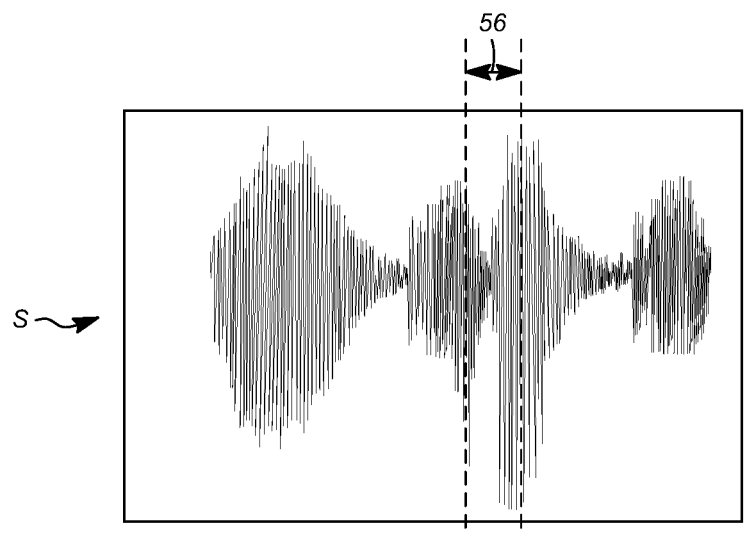
FIG. 4 is a pictorial representation of an audio signal to be encoded by the encoder of FIG. 3.
Figure 5:
FIG. 5 is a pictorial representation of a video signal to be encoded by the encoder of FIG. 3.

FIG. 3 is a block diagram of a signal encoder 32 used in the transmission station 22 of FIG. 1. In one exemplary embodiment, encoder 32 can be implemented by or in processing unit 28, as explained above. Generally speaking, encoder 32 accepts as input a data signal S, such as an audio signal (FIG. 4) or video signal (FIG. 5). Encoder 32 encodes the input signal S by decomposing it into a sequence or list of fragments 42 (hereinafter referred to as fragment list 42). The fragments of fragment list 42 are described below, but generally each includes an index value and a projection value. Fragment list 42 is included in an output signal Y transmitted by a signal transmitting stage 44 on forward link 26 to receiving station 24. Certain fragments can be identified as having a higher level of importance than others. A higher quality reconstruction can be achieved if these more important fragments are successfully transmitted. Therefore, encoder 32 transmits more important fragments multiple times to increase the probability that at least one copy of the each of the important fragments is received by receiving station 24. However, as explained below, the loss of packets containing a given fragment (even a so-called important fragment) need not substantially degrade the reconstructed signal, which is generated using the data in multiple fragments.

Still referring to FIG. 3, encoder 32 has various stages to perform its encoding functions. These functions are described in more detail with reference to FIGS. 9 and 10. In one exemplary embodiment, the stages of encoder 32 can include a signal receiving stage 34, where an input signal S is accepted; a residual calculator stage 36 in which the input signal S is compared to a reconstructed signal REC to produce a residual signal R; a fragment calculator stage 38 where a new fragment is determined using the content of a dictionary 40, described below; and a decoder 46. The new fragment is added to a dynamic fragment list 42. The structure of fragment list 42 is explained below in conjunction with FIG. 8. When encoding processing is complete, the final fragment list 42 is transmitted as a component of output signal Y via the signal transmitting stage 44. As explained below, in some embodiments, selected fragments of fragment list 42 can be duplicated in output signal Y to provide redundancy. Encoder 32 can further compress output signal Y through entropy coding, for example. This further compression can be done in a context-free fashion so that each fragment can be compressed independently and does not depend on information in other fragments (as these can be lost in transmission). One suitable entropy coding scheme is Huffman coding.

Exemplary structures for the fragments, fragment list and dictionary are described below. Dictionary 40 and fragment list 42 can be stored in any suitable memory (such as RAM or disk storage) and can both reside on the same physical storage area or can reside on different storage areas of the same or different types.

Encoder 32 includes a decoder stage 46 in a return path 48. Decoder stage 46 generates a reconstruction signal REC of original signal 34. Reconstruction signal REC is synthesized from the fragment list 42 using the dictionary 40. An example of the operation of decoder stage 46 is provided in FIG. 10 below. Residual calculator stage 36 uses reconstruction signal REC to determine a residual signal R. As explained below in more detail, when residual signal R is at or below a threshold, encoding processing can terminate.

Input signal S can be data of any type, but in some applications can be audio or video. FIG. 4 is a pictorial representation of input signal S in the form of an audio signal to be encoded by the encoder 32 of FIG. 3. FIG. 5 is a pictorial representation of input signal S in the form of a video signal to be encoded by encoder 32 of FIG. 3.

Referring to FIG. 6, the structure and function of dictionary 40 is explained. Dictionary 40 is used by encoder 32 of FIG. 3 (and dictionary 64 is used by the decoder 60 of FIG. 7) to reconstruct an approximation of input signal S using the fragment list 42 generated by encoder 32. In one exemplary embodiment, dictionary 40 can be a relational database that comprises a plurality of rows or records 50. Each record can have an index field 52 and a value field 54. The index field contains an integer (i) that serves as a primary key to dictionary 40, uniquely identifying each of rows 50. The value field 54 contains a value $U_i$, which can correspond mathematically to a component of input signal S. For example, a particular value contained in value field 54 can correspond to a sample 56 of an audio input signal S as shown in FIG. 4. Alternatively, a particular value in value field 54 can correspond to a block 58 of a video input signal S as shown in FIG. 5. Value field 54 can contain a scalar, a vector or array, or a matrix, although it is illustrated as containing a scalar in FIG. 6. The values $U_i$ of dictionary 40 are referred to herein generally as signal elements, and can form an over-complete set so that any signal can be recovered by at least one finite weighted sum of the dictionary entries. The values of value field 54 are real numbers that can be normalized so that the sum of their squares equals one.

Dictionary 40 can be optimized based on the particular type or category of signal used as input. In some cases, for example, dictionary 40 can be comprised of synthesized samples such as time-translated sinusoidal audio waves or Fourier basis. Alternatively, dictionary 40 can comprise signal elements that are random excerpts from actual signals. The entries in dictionary 40 can be combined and trimmed with genetic algorithms, for example. The dictionary can be updated over time based on empirical results to improve performance of encoder 32. Dictionaries 40 and 64 can be implemented in the form of any suitable data structure, such as a relational database table, list, metadata repository, associative array or any other structure that can store signal elements in a manner that permits the elements to be looked-up, referenced or otherwise accessed such as for example by using an index value. The term "dictionary" refers to all such structures. In the exemplary embodiments, the index values stored in fragment list 42 are intended to match unique index values of a dictionary such as the values of index field 52 of dictionary 40. Other implementations for looking up signal elements (such as hashing of index values) can be used as well and the term "index" refers to all such implementations by which a value can be used to locate a signal element in a dictionary.

FIG. 7 is a block diagram of receiving station 24 of FIG. 1. In one exemplary embodiment, receiving station 24 includes a decoder 60 that operates in a manner similar to decoder stage 46 in encoder 32 (FIG. 3). Decoder 60 receives as input a fragment list 62. Subject to transmission losses, fragment list 62 can be identical to output signal Y of encoder 32, which can include duplicate fragments that are generated for redundancy. Input fragment list 62 may not be a complete rendition of output signal Y because packets may have been lost during transmission on forward link 26. Decoder 60 processes input fragment list 62 using a dictionary 64, which is a copy of dictionary 40 used by encoder 32 (FIG. 3). Decoder 60 can be provisioned with dictionary 64 when it is first published, and dictionary 64 can be periodically updated to synchronize with dictionary 40. For example, dictionary 40 can include a version header which can be inspected by decoder 60 to determine whether the dictionary 64 is the same version as the dictionary 40 used by encoder 32. If dictionary 60 is not the same version, decoder 60 can request an update to its dictionary 64 such as from the publisher of decoder 60 or other online service provider. An example of the operation of decoder 60 is provided below in conjunction with FIG. 10. The output of decoder 60 is a reconstructed signal REC 66 that is an approximation of the original input signal S.

FIG. 8 is a diagram of a fragment list 42 generated by encoder 32 and transmitted by signal transmitting stage 44 as part of output signal Y. Fragment list includes a plurality of 1 . . . N fragments (such as 68a and 68b, and generically referred to herein as fragments 68). Each fragment 68 includes an index value (such as 70a and 70b and generically referred to herein as index value 70) and a projection value (such as 72a and 72b and generically referred to herein as projection value 72). The value contained in index value 70 is an integer (i) pointing to the $i^{th}$ record in dictionary 40 and dictionary 64. An individual fragment is sometimes referred to herein as the $k^{th}$ fragment of list 42. The illustrated structure is just one of many ways in which the data of fragment list 42 can be structured. In some cases, additional fields can be included in each element. Fragment list 42 can be implemented using links and pointers in a computer memory or in a database, such as a relational database for example. As explained above in regard to FIG. 6, dictionary 40 (as well as dictionary 64) comprises a plurality of records 50 having an index field 52. Thus, value (i) in the index value 70 of a given fragment 68 points to that one of records 50 of dictionary 40 for example having the same value (i) in its index field 52. The value contained in projection value 72 can be a real number $P_k$ such as between −1 and +1. An exemplary technique for calculating the $P_k$, the value of projection value 72, is provided below in conjunction with FIG. 9. In general terms, the projection value is a transform that can be used to derive amplitudes of the signal elements $U_i$. These amplitude values in turn are used to derive the reconstructed signal REC. Accordingly, each fragment 68 can be a pair of values (index value and projection) and these pairs of values can be stored in a fragment list 42 that is generated by encoder 32. Alternatively, in place of an index, the underlying dictionary value (e.g., in value field 54) of signal element $U_i$ can be included in the fragment 68.

Figure 9:
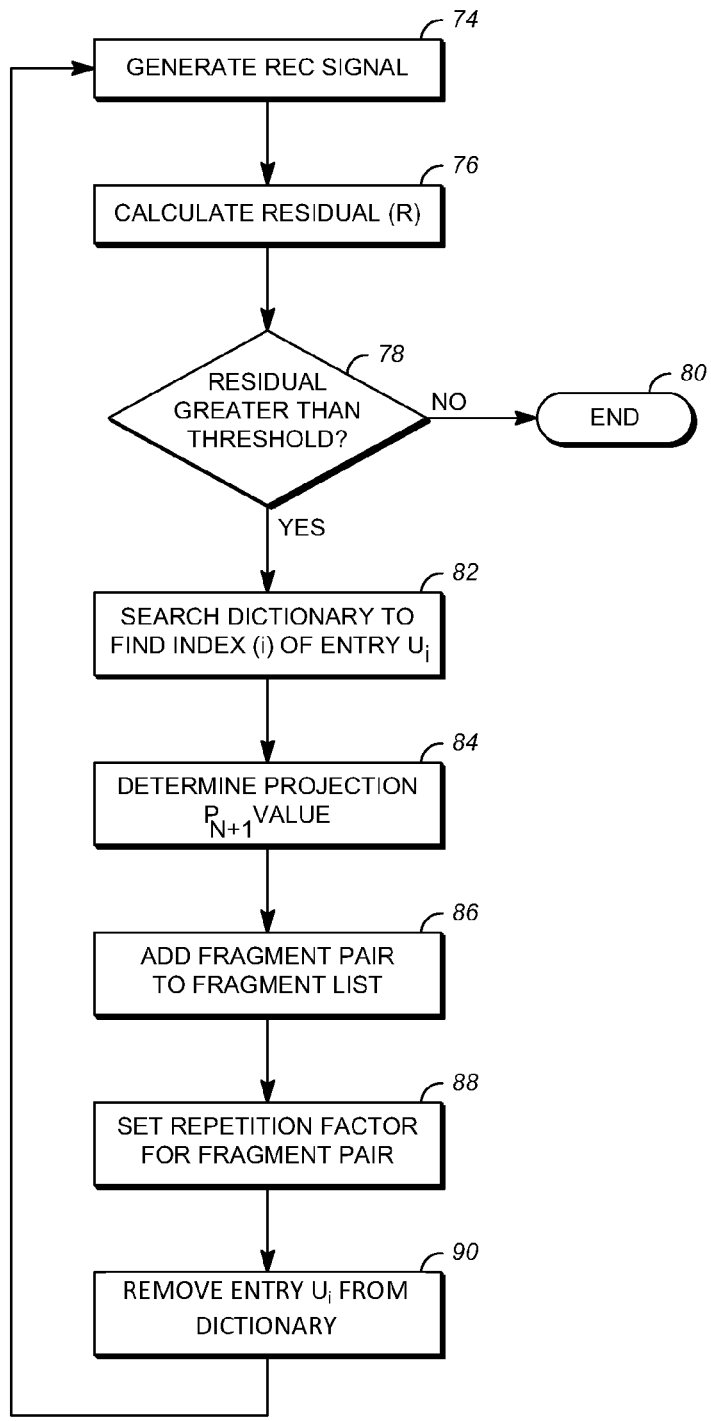
FIG. 9 is a logic flow chart illustrating operation of the encoder of FIG. 3.

FIG. 9 is a logic flow chart illustrating the iterative operation of encoder 32 in one illustrative embodiment. Beginning at block 74, decoder stage 46 (FIG. 3) generates a reconstructed signal REC of the original input signal S using fragment list 42. The operations that occur at block 74 are detailed below in conjunction with FIG. 10. For the first iteration of the logic of FIG. 9, the fragment list may be empty. Therefore, block 74 can be skipped (and the initial reconstructed signal REC set to zero). Next at block 76, residual calculator stage 36 (FIG. 3) generates a residual signal R. This can be accomplished in any suitable fashion, such as for example by subtracting reconstructed signal REC from the input signal S to obtain a residual signal R. At decision block 78, residual signal R is compared to a threshold value. In this example, the squared sum of the pixel values of the residual signal R is compared to the threshold value, which for purposes of illustration can be a number equal to or greater than zero. The threshold value can be based on the desired level of fidelity to be achieved in the coding of input signal S. If it is determined at block 78 that the residual signal R (or value based on the residual signal R) is at or below the threshold value (that is, that a desired level of fidelity has been attained), then encoding process of FIG. 9 terminates at block 80. Otherwise, if the residual signal R (or a value based on residual signal R) is above the threshold value, then processing continues on to blocks 82 through 90, as described below where a new fragment N+1 will be generated and added to the existing list of N fragments 42. Blocks 82 through 90 correspond to fragment calculator stage 38 of FIG. 3. The new fragment will be stored in fragment list 42. Accordingly, signal fragments may be generated sequentially until the fidelity of the reconstructed signal reaches a desired level.

Beginning with block 82, a search is made of dictionary 40 to find that one of the records 50 (FIG. 6) having a desired value $U_i$ in its field 54. The criteria for selecting the desired value of $U_i$ can vary, but in this case the criterion is that the value $U_i$ is selected that maximizes the absolute value of the scalar product of $<R,U_i>$ of residual signal R and the dictionary values $U_i$ for all dictionary entries not yet used in a fragment. As explained above, residual signal R is based on the reconstruction signal REC obtained using the current fragment list of N fragments $\{i_0, P_0\} \ldots \{i_N, P_N\}$.

Any suitable technique can be used to compute that scalar products referred to above. For example, the scalar product of two vectors $u=\{u_i\}_{i=1\ldots N}$ and $v=\{v_i\}_{i=1\ldots N}$ can be expressed as:

$$\langle u, v \rangle = \sum_{i=1}^{N} u_i * v_i \quad \text{(Equation 1)}$$

Having located the desired dictionary record, control moves to block 84, where the value of projection $P_{N+1}$ is determined for use in the new fragment (N+1). The value $P_{N+1}$ can be determined as a function of the original input signal S and the value $U_{i,N+1}$ of the newly selected dictionary record. In this case, for example, the value $P_{N+1}$ can be calculated as the scalar product of the input signal S and the newly selected $U_i$:

$$P_{N+1} = <S, U_{i,N+1}> \quad \text{(Equation 2)}$$

Control then moves to block 86, where a new fragment is created and appended to to the existing list of N fragments as new fragment $\{i_{N+1}, P_{N+1}\}$. As explained above, each fragment 68 contains an index value (i) stored in index value field 70 and a projection value ($P_{N+1}$) stored in the projection value field 72. The value of the index field 70 in fragment 68 points to that one of the records 50 of dictionary 40 containing the desired value of $U_i$. The value $P_{N+1}$ as computed at block 84 is stored in the projection value 72 of the new fragment $\{i_{N+1}, P_{N+1}\}$. Thus, the new fragment contains a pointer (i) to the desired record of dictionary 40 and a corresponding projection value $P_{N+1}$. To achieve further loss compression, the value of $P_{N+1}$ can be quantized by mapping it to a finite set of integer values. This quantization if performed can be part of the encoding loop (as opposed to post processing) to provide better results.

Control then moves to block 88, where the repetition factor is determined for the new fragment record. In this case, the repetition factor can be an integer such as between 1 and 7, which determines how many duplicate copies of the fragment $\{i_{N+1}, P_{N+i}\}$ will be transmitted as part of output signal Y (FIG. 3). The repetition factor can be determined as a function of the importance of the fragment to the overall reconstructed signal. For example, the repetition factor for the $k^{th}$ fragment 68 in fragment list 42 can be a function of the absolute value of the scalar product of $<R,U_{i,k}>$, which in physical terms can be an indication of the transform energy associated with the fragment. In other words, a higher absolute value of scalar product of $<R,U_{i,k}>$ can indicate that the $k^{th}$ fragment containing the value $U_{i,k}$ is relatively more important than other fragments 68 and accordingly should be duplicated more times. The additional redundancy factor minimizes the effect of packet loss. That is, if the $k^{th}$ fragment is important and is duplicated three times (for example), there is an increased likelihood that at least one of the three copies will reach receiving station 24.

Control then moves to block 90, where the selected one of records 50 of dictionary 40 (that is, the record corresponding to the index (i) and desired value $U_i$) is marked so that it will not be selected again by the encoder for use in creating a fragment. Thus, each entry of dictionary 40 is used only once to generate a fragment 68, although that fragment may be duplicated in the output signal depending on the repetition factor for that fragment.

It will be understood that with each iteration of the process described in FIG. 9, fragments representing ever decreasing transform energy can be added to the fragment list. With each new fragment, the reconstructed signal REC has greater fidelity to the original input signal S. Fragments can be added until the resulting reconstructed signal REC is of sufficiently high quality (so that the residual signal R or a value based on residual signal R is at or below the threshold).

Figure 10:
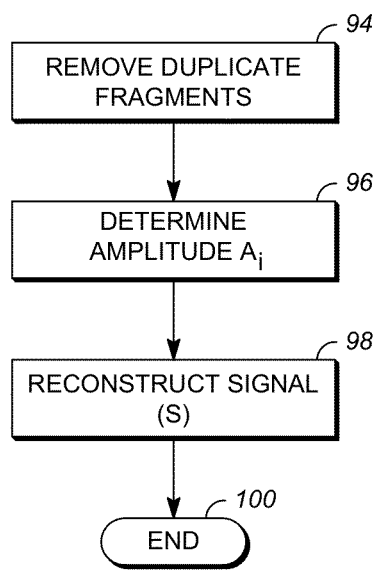
FIG. 10 is a logic flow chart illustrating operation of the decoder of FIG. 7.

FIG. 10 is a logic flow chart illustrating operation of the decoder stage 46 of FIG. 3 and decoder 60 of FIG. 7 in one illustrative embodiment. For convenience, the blocks of FIG. 10 are described with respect to decoder 60. Decoder stage 46 operates in substantially the same manner as decoder 60 except that decoder stage 46 uses as its input fragment list 42 and dictionary 40 and its output is reconstructed signal REC. Decoder 60 processes as input a list of N fragments in the form of fragment list 62. As explained above, fragment list 62 can be identical to the fragment list 42 that is included in output signal Y, except that duplicate copies of important fragments in fragment list 42 may be included in output signal Y (and thus included in input fragment list 62) for purposes of redundancy as a countermeasure to the possibility of data loss during transmission on forward link 26 (FIG. 1). Accordingly, block 94 is included to remove duplicate fragments.

Also, despite redundancy, some fragments in fragment list 42 that are included in output signal Y may be lost during transmission on forward link 26 and therefore such lost fragments will not be included in input fragment list 62. Thus, in an exemplary case, if there are no duplicate copies of fragments in output signal Y and no transmission losses, fragment list 62 can be identical to fragment list 42 after encoding is complete. It should be noted that transmission of fragment list 42 (as included in output signal Y) can be performed on a frame-by-frame basis so that the entire video or audio stream need not be encoded before fragments are transmitted.

Control next moves to a block 96, where the amplitude $A_k$ for each $k^{th}$ fragment is determined based upon the value $P_k$ contained in the $k^{th}$ fragment's projection field 72. One exemplary technique for computing amplitude $A_k$ is to solve the following linear system for the unknown coefficient $A_j$ $$\forall k \in k[[1, N]] \sum_{j=1}^{N} A_j * \langle U_{i,k}, U_{i,j} \rangle = P_k \quad \text{(Equation 3)}$$

where the index k refers to the $k^{th}$ entry in deduplicated fragment list 62. Other techniques can be used to find the amplitude.

Control next moves to a block 98, where the reconstructed signal REC is determined using the values of amplitude $A_k$. One exemplary technique for computing REC is to compute the sum of the dictionary values $U_{i,k}$ weighted by the corresponding amplitudes in accordance with the following equation:

$$REC = \sum_{k=1}^{N} A_k * U_{i,k} \quad \text{(Equation 4)}$$

where k ranges from 1 to N, the total number of fragments, $A_k$ is determined by solving the linear system described in Equation 3 above; and $U_{i,k}$ is the dictionary value at that one of dictionary records 50 to which the $k^{th}$ fragment's index (i) points.

Control next moves to block 100, where processing of FIG. 10 terminates.

In a physical sense, the amplitude $A_k$ associated with each fragment 68 is a measure of the amplitude of that fragment's normalized dictionary value $U_{i,k}$. The projection $P_k$ is a transform of that amplitude value. By transmitting the projection values $P_k$, more robust communications may be provided than if, for example, the amplitudes $A_i$ themselves were transmitted. This is because the loss of an amplitude $A_k$ value can result in a more severe degradation of the reconstructed signal REC than the loss of a projection value $P_k$.

The functions of encoder 32 and decoder 60 can be implemented as an application computer program or other software that can be executed a computing device such as processing unit 28. Alternatively, the logic of encoder 32 and decoder 60 implemented in hardware such as in firmware or on an ASIC or other specialized chip, or in a combination of hardware and software. All or a portion of embodiments of the present invention can take the form of a computer program product accessible from, for example, a computer-usable or computer-readable medium. A computer-usable or computer-readable medium can be any signal device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

The invention claimed is:

1. A method for encoding a data signal, comprising:
   accessing a set of signal elements stored in a memory; and
   generating a plurality of signal fragments, wherein each of at least some of the plurality of signal fragments are associated with (i) at least one signal element selected from the set of signal elements, and (ii) a transform value that is calculated as a function of at least a portion of the data signal and the at least one signal element.

2. The method of claim 1, wherein the set of signal elements is configured such that the data signal can be approximated from a weighted sum of a subset of the set of signal elements.

3. The method of claim 1, wherein generating the plurality of signal fragments further comprises successively adding new signal fragments to the plurality of signal fragments until the plurality of signal fragments is of a number to permit reconstruction of the data signal with a level of fidelity that exceeds a threshold.

4. The method of claim 1, further comprising:
   determining a repetition factor for at least some of the plurality of signal fragments, wherein the repetition factor for each such signal fragment is based at least in part on the signal element associated with that signal fragment.

5. The method of claim 4, wherein determining the repetition factor for a specific signal fragment further comprises determining a transfer energy value associated with the specific signal fragment; and determining the repetition factor as a function of the transfer energy value.

6. The method of claim 4, further comprising:
   transmitting the plurality of signal fragments, including duplicate copies of at least one of the signal fragments based on the repetition factor.

7. The method of claim 1, wherein generating the plurality of signal fragments further comprises generating the plurality of signal fragments sequentially and, after each signal fragment is generated, generating a reconstructed signal using the plurality of signal fragments and determining the fidelity of the reconstructed signal.

8. The method of claim 1, further comprising:
   determining a plurality of amplitudes ($A_k$) using the signal fragments; and
   determining a reconstructed signal (REC) using the plurality of amplitudes ($A_k$) and the signal elements associated with each of the plurality of signal fragments.

9. The method of claim 8, wherein determining the plurality of amplitudes ($A_k$) further comprises solving a linear system.

10. The method of claim 8, wherein the linear system is expressed as follows:

$$\forall k \in k[[1, N]] \sum_{j=1}^{N} A_j * \langle U_{i,k}, U_{i,j} \rangle = P_k$$

wherein N is the number of signal fragments, $U_{i,j}$ is the $j^{th}$ signal fragment $U_i$ among the set of signal elements, and $P_k$ is the transform value in the $k_{th}$ signal fragment.

11. The method of claim 8, wherein the amplitude ($A_k$) for each $k^{th}$ signal fragment $U_{i,k}$ in the plurality of signal elements is determined based upon the transform value associated in the $k_{th}$ signal fragment.

12. The method of claim 8, wherein determining the reconstructed signal further comprises setting the reconstructed signal (REC) equal to:

$$REC = \sum_{k=1}^{N} A_k * U_{i,k}.$$

wherein N is the number of signal fragments and $U_{i,j}$ is the $j^{th}$ signal fragment $U_i$ among the set of signal elements.

13. The method of claim 8, further comprising:
determining a residual signal based on differences between the data signal and the reconstructed signal (REC);
determining the scalar product of the residual signal (R) and at least one of the signal elements in the set of signal elements; and
selecting at least one of the signal elements from the set of signal elements based on the determined scalar product.

14. The method of claim 1, further comprising:
transmitting the plurality of signal fragments to a decoder that has access to a copy of the set of signal elements used to encode the data signal.

15. The method of claim 1, wherein the data signal includes signal elements that are at least one of audio data or video data.

16. A method for encoding a data signal, comprising:
accepting as input the data signal to be encoded;
storing in memory a set of signal elements that includes elements not found in the data signal; and
generating a list of fragments from which can be derived an approximation of the data signal, at least some of the fragments referencing at least one of the signal elements selected from the set of signal elements;
wherein the list of fragments is generated by an iterative process of adding at least one new fragment to the list of fragments, using the list of fragments to generate a reconstructed signal, and using a processor to determine the fidelity of the reconstructed signal.

17. The method of claim 16, wherein the iterative process is repeated until the determined fidelity reaches a threshold.

18. The method of claim 16, wherein the set of signal elements is configured such that the data signal can be approximated from a weighted sum of a subset of the signal elements.

19. The method of claim 16, further comprising:
determining a repetition factor for at least one signal fragment in the list of signal fragments, based at least in part on the signal element referenced by that fragment; and
transmitting the list of signal fragments including a number of duplicate copies of the at least one fragment; wherein the number of duplicate copies is determined using the repetition factor.

20. The method of claim 16, further comprising:
determining a category into which the data signal falls; and
selecting the set of signal elements from a plurality of dictionaries based upon the determined category.

21. An apparatus for encoding a data signal, comprising:
a memory;
a processor coupled to the memory and configured to execute instructions stored in memory to:
select a plurality of signal elements from a set of signal elements;
for at least one of the selected plurality of signal elements, calculate a projection value as a function of the selected signal element and at least a portion of the data signal; and
generate a plurality of signal fragments, at least one signal fragment including the projection value and a value associating the at least one signal fragment with that one of the plurality of selected signal elements used to generated the projection value.

22. The apparatus of claim 21, wherein the set of signal elements is configured such that the data signal can be approximated from a weighted sum of a subset of the set of signal elements.

23. The apparatus of claim 21, wherein the processor is further configured to calculate the projection value as a scalar product of data signal and the newly selected signal element.

24. The apparatus of claim 21, wherein the processor is further configured to successively generate newly added fragments until the plurality of signal fragments is sufficient to permit reconstruction of the data signal with a level of fidelity that exceeds a threshold.

25. The apparatus of claim 21, wherein at least some of the set of signal elements are derived from a source other than the data signal.

* * * * *